(12) United States Patent
Wang et al.

(10) Patent No.: US 11,127,817 B2
(45) Date of Patent: Sep. 21, 2021

(54) FORMATION OF SEMICONDUCTOR DEVICE STRUCTURE BY IMPLANTATION

(71) Applicant: Taiwan Semiconductor Manufacturing Co., Ltd., Hsinchu (TW)

(72) Inventors: Tsan-Chun Wang, Hsinchu (TW); Chiao-Ting Tai, New Taipei (TW); Che-Fu Chiu, New Taipei (TW); Chun-Feng Nieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/121,830

(22) Filed: Sep. 5, 2018

(65) Prior Publication Data

US 2020/0020772 A1  Jan. 16, 2020

Related U.S. Application Data

(60) Provisional application No. 62/697,699, filed on Jul. 13, 2018.

(51) Int. Cl.
| | |
|---|---|
| *H01L 29/08* | (2006.01) |
| *H01L 21/265* | (2006.01) |
| *H01L 21/768* | (2006.01) |
| *H01L 21/225* | (2006.01) |
| *H01L 29/66* | (2006.01) |
| *H01L 29/78* | (2006.01) |

(52) U.S. Cl.
CPC ...... *H01L 29/0847* (2013.01); *H01L 21/2253* (2013.01); *H01L 21/26513* (2013.01); *H01L 21/76843* (2013.01); *H01L 29/66492* (2013.01); *H01L 29/66795* (2013.01); *H01L 29/785* (2013.01); *H01L 2029/7858* (2013.01)

(58) Field of Classification Search
CPC .......... H01L 21/76831; H01L 21/2253; H01L 21/26506; H01L 29/66492; H01L 21/76843; H01L 29/785; H01L 29/66795; H01L 29/0847; H01L 21/28518; H01L 29/165; H01L 21/26513; H01L 21/76856; H01L 2029/7858; H01L 21/76855; H01L 29/66545
See application file for complete search history.

(56) References Cited

U.S. PATENT DOCUMENTS

| | | | |
|---|---|---|---|
| 6,703,294 B1* | 3/2004 | Schoner | .................. C30B 31/22 257/E21.057 |
| 9,536,844 B1* | 1/2017 | Brewer | ..................... H01L 23/66 |
| 10,164,048 B1* | 12/2018 | More | ..................... H01L 29/665 |
| 10,347,762 B1* | 7/2019 | Liu | ..................... H01L 21/31155 |
| 2002/0033511 A1* | 3/2002 | Babcock | ............ H01L 21/26506 257/408 |

(Continued)

*Primary Examiner* — Savitri Mulpuri
(74) *Attorney, Agent, or Firm* — Birch, Stewart, Kolasch & Birch, LLP

(57) ABSTRACT

A method for forming a semiconductor device structure is provided. The method includes forming a semiconductor structure over a semiconductor substrate. The method also includes implanting carbon into the semiconductor structure. The method further includes implanting gallium into the semiconductor structure. In addition, the method includes heating the semiconductor structure after the implanting of carbon and gallium.

20 Claims, 14 Drawing Sheets

(56) References Cited

U.S. PATENT DOCUMENTS

| | | | |
|---|---|---|---|
| 2006/0105559 A1* | 5/2006 | Chen | H01L 21/76243 438/607 |
| 2008/0026544 A1* | 1/2008 | Tsuchida | C30B 29/36 438/471 |
| 2008/0142785 A1* | 6/2008 | Datta | H01L 29/201 257/19 |
| 2009/0191679 A1* | 7/2009 | Ouyang | H01L 21/823807 438/276 |
| 2009/0246705 A1* | 10/2009 | Blasiak | G03F 7/3021 430/313 |
| 2012/0108020 A1* | 5/2012 | Baldwin | H01L 28/22 438/210 |
| 2013/0256664 A1* | 10/2013 | Qin | H01L 21/823807 257/57 |
| 2013/0260549 A1* | 10/2013 | Jagannathan | H01L 21/28518 438/592 |
| 2016/0247894 A1* | 8/2016 | Hamada | H01L 29/6606 |
| 2018/0068857 A1* | 3/2018 | Adusumilli | H01L 29/161 |

* cited by examiner

FORMATION OF SEMICONDUCTOR DEVICE STRUCTURE BY IMPLANTATION

PRIORITY CLAIM AND CROSS-REFERENCE

This Application claims the benefit of U.S. Provisional Application No. 62/697,699, filed on Jul. 13, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
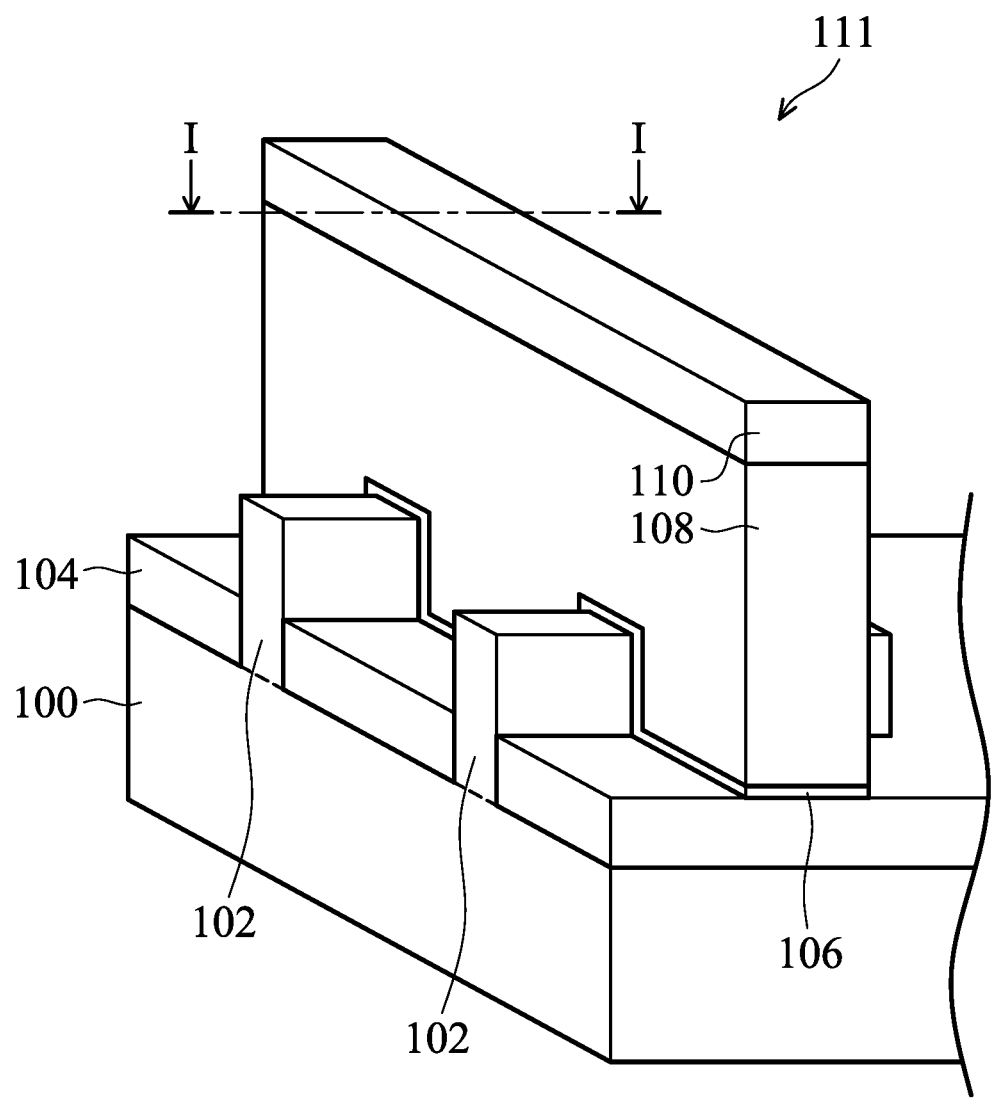
FIGS. 1A-1C are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Figure 1B:
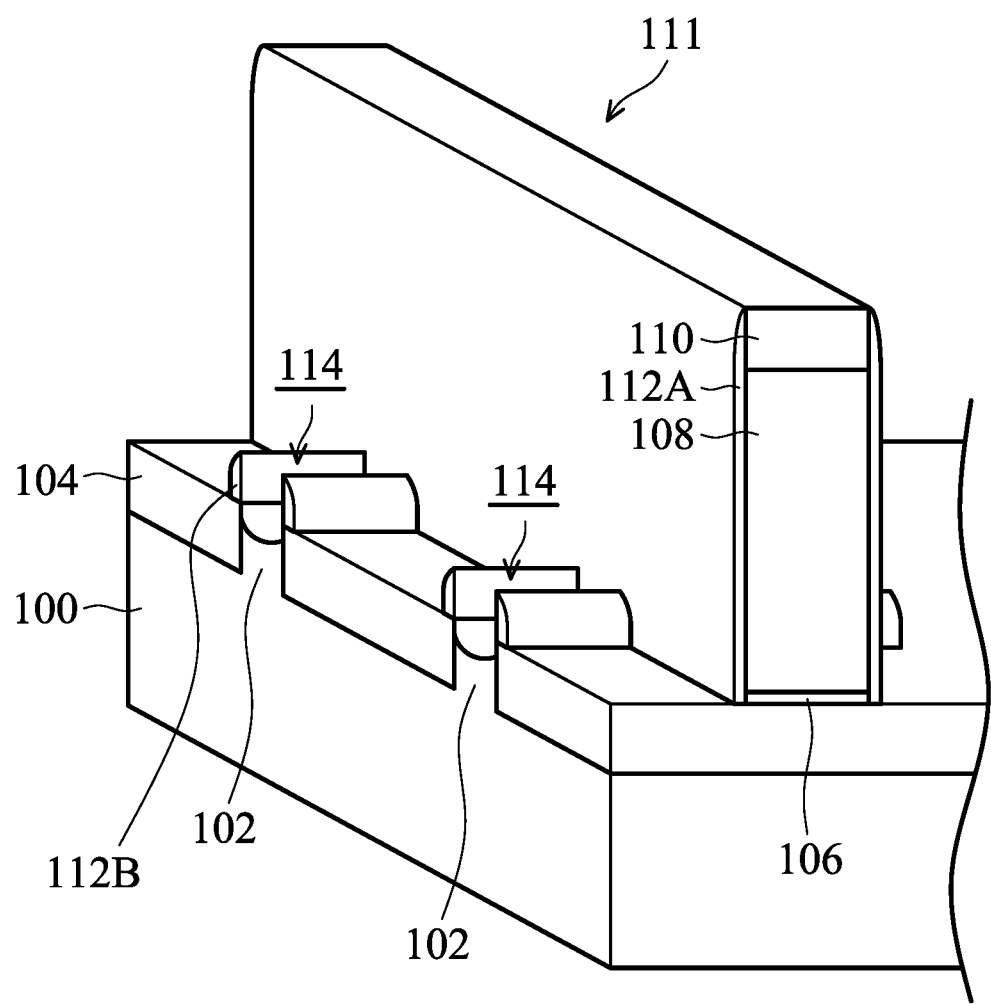
Figure 1C:
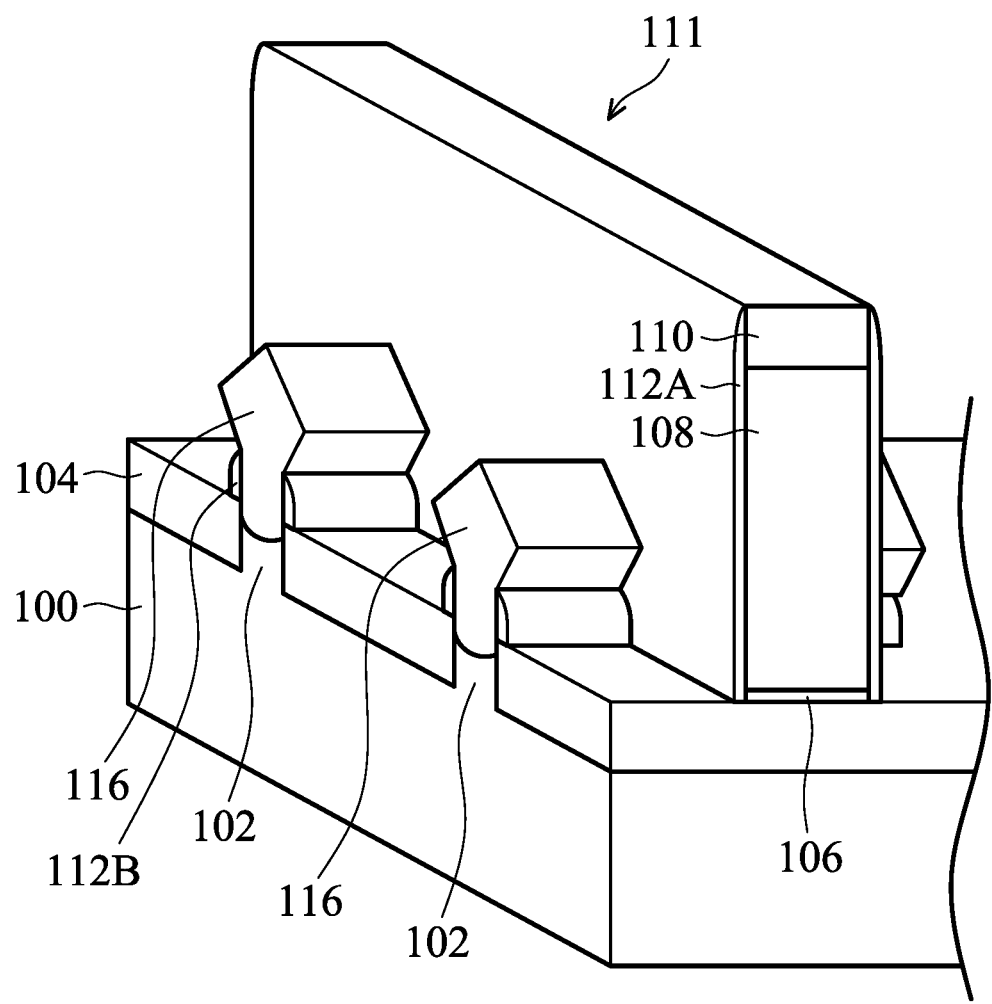
Figure 2A:
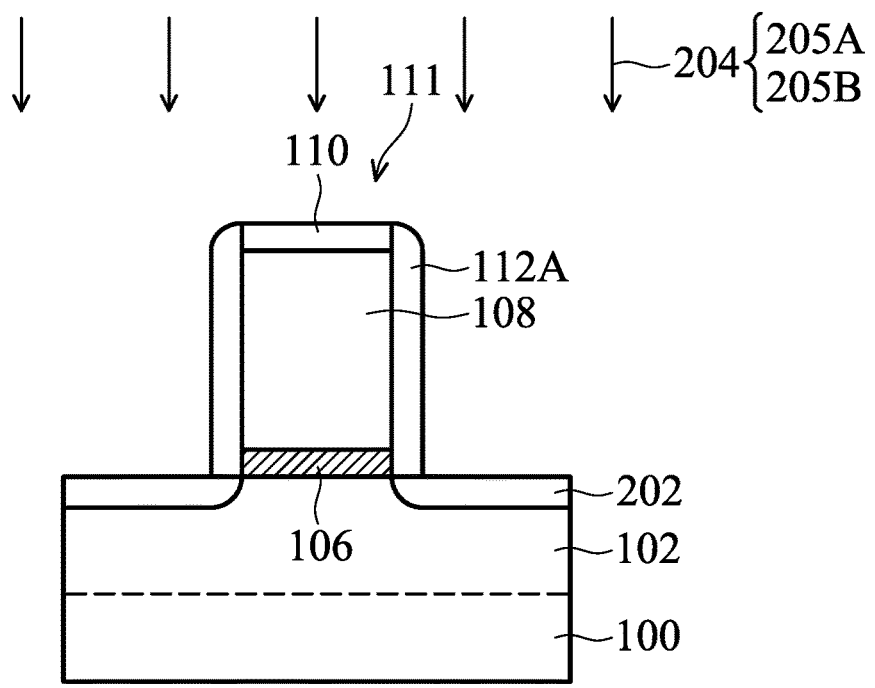
FIGS. 2A-2G are cross-sectional views of various stages of a process for forming a semiconductor device structure, in accordance with some embodiments.

FIGS. 1A-1C are perspective views of various stages of a process for forming a semiconductor device structure, in accordance with some embodiments. FIGS. 2A-2G are cross-sectional views of various stages of a process for forming a semiconductor device structure, in accordance with some embodiments. In some embodiments, FIG. 2A shows the cross-sectional view of the structure taken along the line I-I in FIG. 1A.

As shown in FIGS. 1A and/or 2A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple recesses (or trenches) are formed in the semiconductor substrate 100, in accordance with some embodiments. As a result, multiple fin structures 102 are formed or defined between the recesses. The fin structures 102 may be made of or include silicon, silicon germanium, germanium, one or more other suitable materials, or a combination thereof. In some embodiments, one or more photolithography and etching processes are used to form the recesses. FIG. 2A shows one of the fin structures 102. In some embodiments, the fin structures 102 are in direct contact with the semiconductor substrate 100.

However, embodiments of the disclosure have many variations and/or modifications. In some other embodiments, the fin structures 102 are not in direct contact with the semiconductor substrate 100. One or more other material layers may be formed between the semiconductor substrate 100 and the fin structures 102. For example, a dielectric layer may be formed between the semiconductor substrate 100 and the fin structures 102.

As shown in FIG. 1A, isolation features 104 are formed in the recesses to surround lower portions of the fin structures 102, in accordance with some embodiments. The isolation features 104 are used to define and electrically isolate various device elements formed in and/or over the semiconductor substrate 100. In some embodiments, the isolation features 104 include shallow trench isolation (STI) features, local oxidation of silicon (LOCOS) features, another suitable isolation feature, or a combination thereof.

In some embodiments, each of the isolation features 104 has a multi-layer structure. In some embodiments, the isolation features 104 are made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation features 104. Similarly, the STI liner may also be used to reduce crystalline defects at the interface between the isolation features 104 and the fin structures 102.

In some embodiments, a dielectric material layer is deposited over the semiconductor substrate 100. The dielectric material layer covers the fin structures 102 and fills the recesses between the fin structures. The dielectric material layer may be deposited using a chemical vapor deposition (CVD) process, an atomic layer deposition (ALD) process, a physical vapor deposition (PVD) process, a spin-on process, one or more other applicable processes, or a combination thereof.

In some embodiments, a planarization process is then used to thin down the dielectric material layer until the fin structures 102 or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back such that the fin structures 102 protrude from the top surface of the remaining dielectric material layer after the etching process. As a result, the remaining portions of the dielectric material layer form the isolation features 104, as shown in FIG. 1A.

Afterwards, a gate stack 111 is formed over the semiconductor substrate 100 to partially cover the fin structures 102, as shown in FIGS. 1A and/or 2A in accordance with some embodiments. The gate stack 111 extends across the fin structures 102. The gate stack 111 includes a gate electrode 108 and a gate dielectric layer 106. In some embodiments, a gate dielectric material layer and a gate electrode material layer are deposited over the isolation features 104 and the fin structures 102. Afterwards, the gate dielectric material layer and the gate electrode material layer are patterned to form the gate stack 111 including the gate electrode 108 and the gate dielectric layer 106.

In some embodiments, the gate dielectric material layer is made of or includes silicon oxide, silicon nitride, silicon oxynitride, dielectric material with a high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K dielectric materials, or a combination thereof. In some embodiments, the gate dielectric material layer is a dummy gate dielectric layer which will be removed subsequently. The dummy gate dielectric material layer is, for example, a silicon oxide layer.

In some embodiments, the gate dielectric material layer is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode material layer is made of or includes polysilicon, amorphous silicon, germanium, silicon germanium, metal materials (such as tungsten, titanium, tantalum, ruthenium, zirconium, cobalt, copper, aluminum, platinum, tin, silver, gold, or a combination thereof), carbon nanotube, conductive carbon, one or more other suitable materials, or a combination thereof. In some embodiments, the gate electrode material layer is a dummy gate electrode layer and is made of or includes a semiconductor material such as polysilicon. For example, the dummy gate electrode layer is deposited using a CVD process or another applicable process.

Afterwards, a patterned hard mask element 110 is formed over the gate electrode material layer, in accordance with some embodiments. The patterned hard mask element 110 is used to pattern the gate electrode material layer and the gate dielectric material layer into the gate stack 111. Afterwards, the gate electrode material layer and the gate dielectric material layer are etched with the patterned hard mask element 110 as an etching mask. As a result, the gate stack 111 is formed, as shown in FIGS. 1A and/or 2A in accordance with some embodiments.

In some embodiments, sealing elements (not shown) are formed over sidewalls of the gate stack 111. The sealing elements may be made of or include silicon nitride, silicon oxynitride, silicon carbide, silicon carbon oxynitride, one or more other suitable materials, or a combination thereof. After the formation of the sealing elements, an ion implantation process 204 is used to form lightly doped source/drain regions 202 in the fin structures 102, as shown in FIG. 2A in accordance with some embodiments.

In some embodiments, the ion implantation process 204 includes a first operation 205A and a second operation 205B. Different ions are separately implanted into the fin structures 102 to form the lightly doped source/drain regions 202, in accordance with some embodiments.

In the first operation 205A, a first dopant is implanted into a semiconductor structure such as the fin structure 102. In some embodiments, the first dopant has a smaller atomic radius than that of silicon. In some embodiments, the first dopant is or includes carbon. In the second operation 205B, a second dopant is implanted into the fin structure 102. In some embodiments, the second dopant has a greater atomic radius than that of boron. In some embodiments, the second dopant is or includes gallium.

However, embodiments of the disclosure are not limited thereto. Many variations and/or modifications can be made to embodiments of the disclosure. In some other embodiments, the implanting of carbon is performed after the implanting of gallium. In these cases, the first dopant has a greater atomic radius than that of boron. In some embodiments, the first dopant is or includes gallium. The second dopant has a smaller atomic radius than that of silicon. In some embodiments, the second dopant is or includes carbon.

The p-type gallium dopants may have many advantages. In some embodiments, gallium has a small diffusion coefficient in a germanium-containing semiconductor structure. In some embodiments, gallium has a higher mass than boron. Therefore, the issue regarding ion straggling may be reduced. Gallium may also be used to efficiently reduce crystallinity of a semiconductor structure due to its high mass.

In some embodiments, the smaller dopant (such as carbon) may occupy the interstitial sites in a semiconductor structure. Therefore, the larger dopant (such as gallium) may be prevented from diffusing away through interstitial diffusion. The distribution of the implanted dopants may be controlled in a better manner, which may lead to a better performance of the implanted semiconductor structure. For example, the profile and area of the lightly doped source/drain regions 202 may be controlled well.

In some embodiments, the smaller dopant (such as carbon) is implanted at an implantation energy that is in a range from about 2 keV to about 10 keV. In some embodiments, the larger dopant (such as gallium) is implanted at an implantation energy that is in a range from about 2 keV to about 6 keV. In some embodiments, the smaller dopant (such as carbon) is implanted at higher implantation energy than the larger dopant (such as gallium).

In some embodiments, the carbon dopants are implanted with a first dosage, and the gallium dopants are implanted with a second dosage. In some embodiments, the first dosage is greater than the second dosage. The first dosage may be in a range from about $2E14$ $cm^{-2}$ to about $1E15$ $cm^{-2}$. The second dosage may be in a range from about $1E14$ $cm^{-2}$ to about $5E14$ $cm^{-2}$.

In some embodiments, the ratio of the first dosage to the second dosage is in a range from about 2 to about 3. In some cases, if the ratio of the first dosage to the second dosage is smaller than about 2, some interstitial sites in the implanted semiconductor structure might not be occupied by carbon. As a result, some gallium dopants may diffuse away through interstitial diffusion. The quality and/or reliability of the semiconductor structure may be negatively affected. In some other cases, if the ratio of the first dosage to the second dosage is greater than about 3, the dopants may be difficult to be well activated. For example, some carbon dopant cluster may be formed, which may also negatively affect the quality and/or reliability of the semiconductor structure.

However, embodiments of the disclosure are not limited thereto. In some other embodiments, the ratio of the first dosage to the second dosage has a different range. For example, the ratio of the first dosage to the second dosage may be in a range from about 1.5 to about 3.5.

As shown in FIG. 2A, after the ion implantation process 204, the lightly doped source/drain regions 202 are formed. In some embodiments, a thermal operation (or an annealing process) is used to activate the dopants in the lightly doped source/drain regions 202. The lightly doped source/drain regions 202 may be heated at a temperature that is in a range from about 900 degrees C. to about 1000 degrees C. In some embodiments, the lightly doped source/drain regions 202 have a dopant concentration of gallium that is in a range from about $1E19$ $cm^{-3}$ to about $1E20$ $cm^{-3}$. In some embodiments, the lightly doped source/drain regions 202 have a dopant concentration of carbon that is in a range from about $1E19$ $cm^{-3}$ to about $1E20$ $cm^{-3}$.

As shown in FIGS. 1B and/or 2A, spacer elements 112A are formed over the sidewalls of the gate stack 111 after the formation of the lightly doped source/drain regions 202, in accordance with some embodiments. The spacer elements 112A may cover the sealing elements. The spacer elements 112A may be used to assist in the formation of source and drain structures (or regions) in subsequent processes. In some embodiments, the spacer elements 112A are made of or include silicon nitride, silicon oxynitride, silicon carbide, silicon carbon oxynitride, one or more other suitable materials, or a combination thereof.

In some embodiments, a spacer layer is deposited over the semiconductor substrate 100, the fin structures 102, and the gate stack 111. The spacer layer may be deposited using a CVD process, an ALD process, a PVD process, a spin-on process, one or more other applicable processes, or a combination thereof. Afterwards, an etching process, such as an anisotropic etching process, is performed to partially remove the spacer layer. As a result, the remaining portions of the spacer layer over the sidewalls of the gate stack 111 form the spacer elements 112A. Other remaining portions of the spacer layer over the sidewalls of the fin structures 102 may form support elements 112B. The support elements 112B may be used to assist in the growth of source and drain structures (or regions) in subsequent processes.

Many variations and/or modifications can be made to embodiments of the disclosure. In some other embodiments, the support elements 112B are not formed.

Figure 2B:
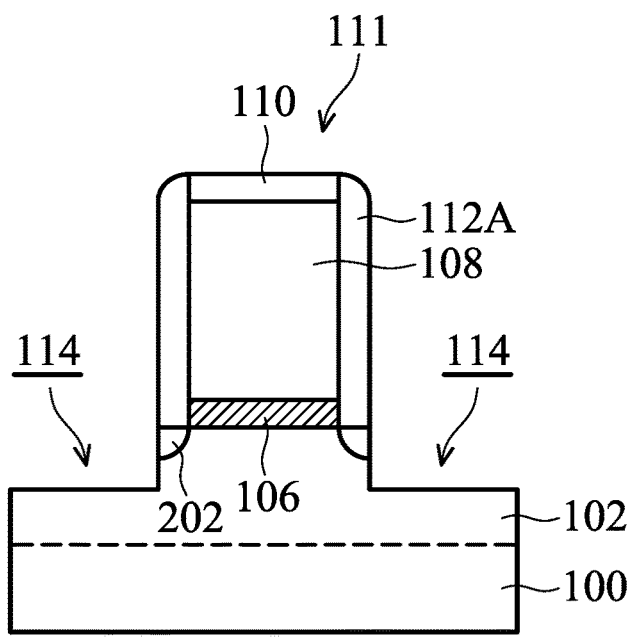

As shown in FIGS. 1B and 2B, the fin structures 102 are partially removed to form recesses 114, in accordance with some embodiments. In some embodiments, the fin structures 102 are recessed to a level below the tops of the support elements 112B. The recesses 114 are surrounded by the support elements 112B. In some embodiments, the fin structures 102 are recessed to a level below the top surfaces of the isolation features 104. In some embodiments, one or more etching processes is/are used to form the recesses 114.

Many variations and/or modifications can be made to embodiments of the disclosure. In some other embodiments, the fin structures 102 are not recessed. In some other embodiments, the fin structures 102 are merely thinned without being recessed to a level below the top surfaces of the isolation features 104.

Figure 2C:
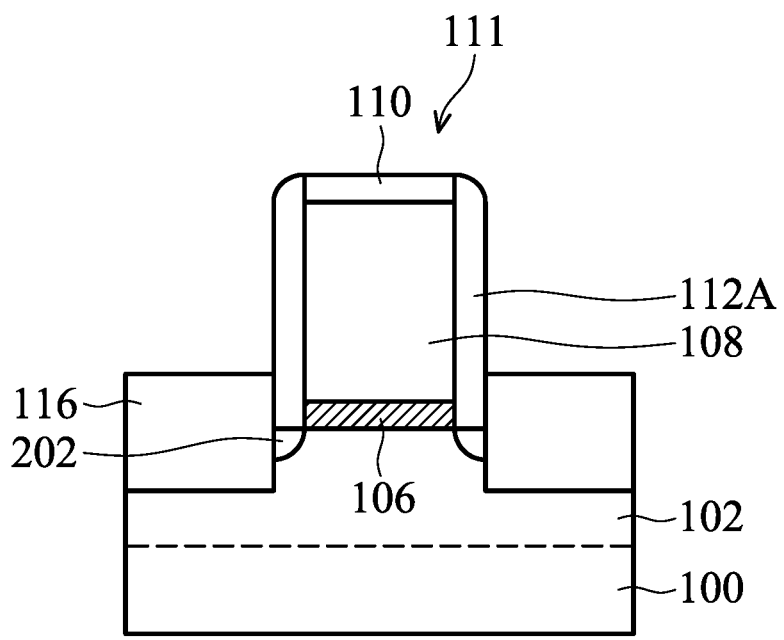

As shown in FIGS. 1C and 2C, one or more semiconductor materials are epitaxially grown over the fin structures 102, in accordance with some embodiments. As a result, epitaxial structures 116 are formed. The epitaxial structures 116 may function as source and drain structures. The epitaxial structures 116 may also function as stressors to improve carrier mobility.

In some embodiments, the epitaxial structures 116 function as p-type source/drain structures and are made of one or more p-type semiconductor materials. For example, the epitaxial structures 116 may include epitaxially grown silicon germanium, epitaxially grown germanium, or another suitable epitaxially grown semiconductor material. The epitaxial structures 116 may include p-type dopants such as boron, gallium, indium, one or more other suitable dopants, or a combination thereof.

In some embodiments, the fin structures 102 include silicon germanium. The fin structures 102 may have an atomic concentration of germanium that is in a range from about 0.2 to about 0.3. In some embodiments, the epitaxial structures 116 include silicon germanium. The epitaxial structures 116 may have an atomic concentration of germanium that is in a range from about 0.45 to about 0.6.

In some embodiments, the epitaxial structures 116 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an ALD process, one or more other applicable processes, or a combination thereof. The process of forming the epitaxial structures 116 may use gaseous and/or liquid precursors.

In some embodiments, the epitaxial structures 116 are doped in-situ during the growth of the epitaxial structures 116. In some other embodiments, one or more doping processes are used to dope the epitaxial structures 116 after the epitaxial growth of the epitaxial structures 116. In some embodiments, the doping is achieved using an ion implantation process, a plasma immersion ion implantation process, a gas and/or solid source diffusion process, one or more other applicable processes, or a combination thereof. In some embodiments, the epitaxial structures 116 are further exposed to one or more annealing processes to activate the dopants. For example, a rapid thermal annealing process is used.

Afterwards, a gate replacement process may be performed to replace the gate stack 111 with a metal gate stack. In some embodiments, a dielectric material layer is deposited over the structure shown in FIG. 1C to cover the epitaxial structures 116, the isolation features 104, and the gate stack 111. The dielectric material layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric material layer is deposited using a CVD process, an ALD process, a PVD process, a spin-on process, one or more other applicable processes, or a combination thereof.

Figure 2D:
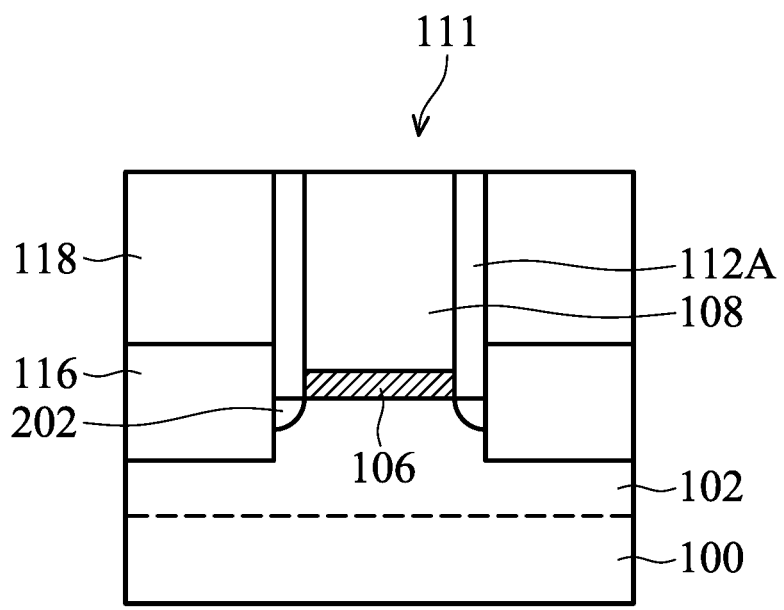

Afterwards, the dielectric material layer is thinned until or after the gate stack 111 is exposed, as shown in FIG. 2D in accordance with some embodiments. The dielectric material layer may be thinned until the hard mask element 110 is exposed. Alternatively, the dielectric material layer may be thinned until the gate electrode 108 is exposed. After the thinning process of the dielectric material layer, the remaining portion of the dielectric material layer forms a dielectric layer 118, as shown in FIG. 2D. The dielectric layer 118 covers the epitaxial structures 116. The dielectric layer 118 also surrounds the gate stack 111.

Figure 2E:
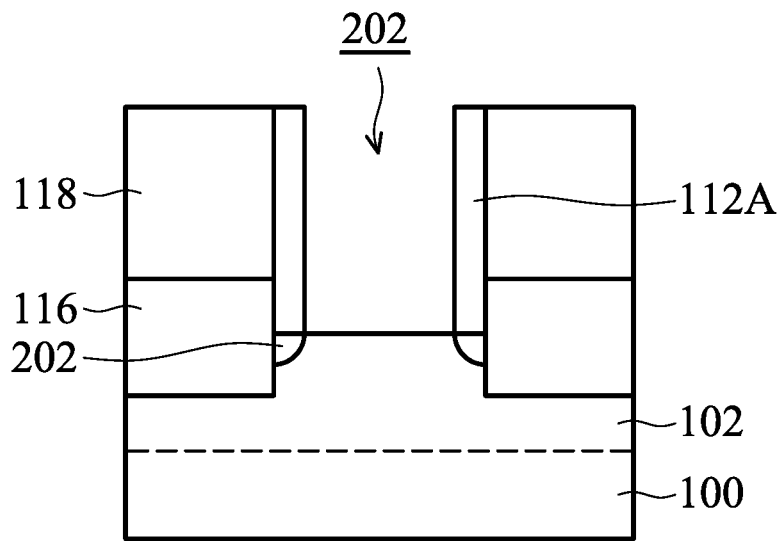

Afterwards, the gate stack 111 is removed to form a trench 202, as shown in FIG. 2E in accordance with some embodiments. One or more etching processes are used to remove the gate electrode 108 and the gate dielectric layer 106. As a result, the trench 202 is formed. The trench 202 may expose the portion of the fin structure 102 originally covered by the gate stack 111, which serves as a channel region. The trench 202 may also expose the isolation features 104 originally covered by the gate stack 111.

Figure 2F:
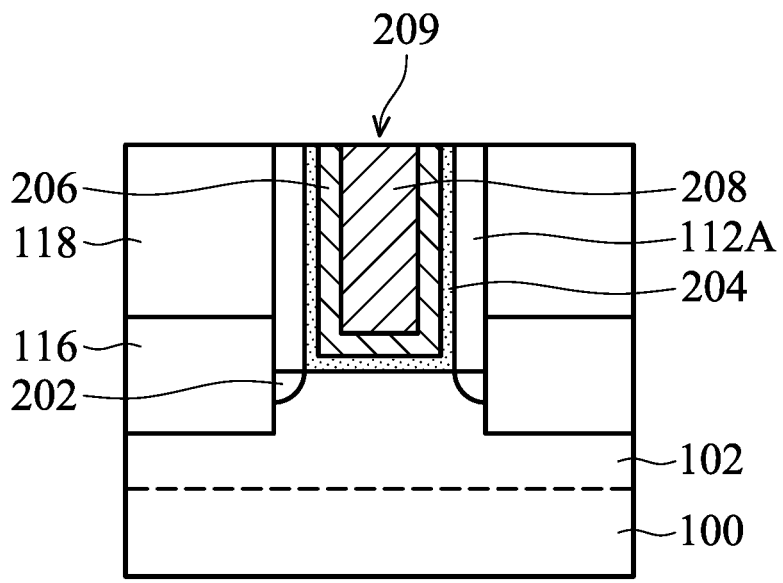

As shown in FIG. 2F, a metal gate stack 209 is formed in the trench 202, in accordance with some embodiments. The metal gate stack 209 may include a high-k gate dielectric layer 204, a work function layer 206, and a metal filling 208. Multiple material layers may be deposited over the dielectric layer 118 to fill the trench 202. The deposition processes may include an ALD process, a CVD process, a PVD process, an electroplating process, one or more other applicable processes, or a combination thereof.

Afterwards, a planarization process is used to remove the portions of the material layers outside of the trench 202. As a result, the remaining portions of the material layers in the trench 202 together form the metal gate stack 209. The planarization process may include a CMP process, a grinding process, a dry polishing process, an etching process, one or more other applicable processes, or a combination thereof.

Figure 2G:
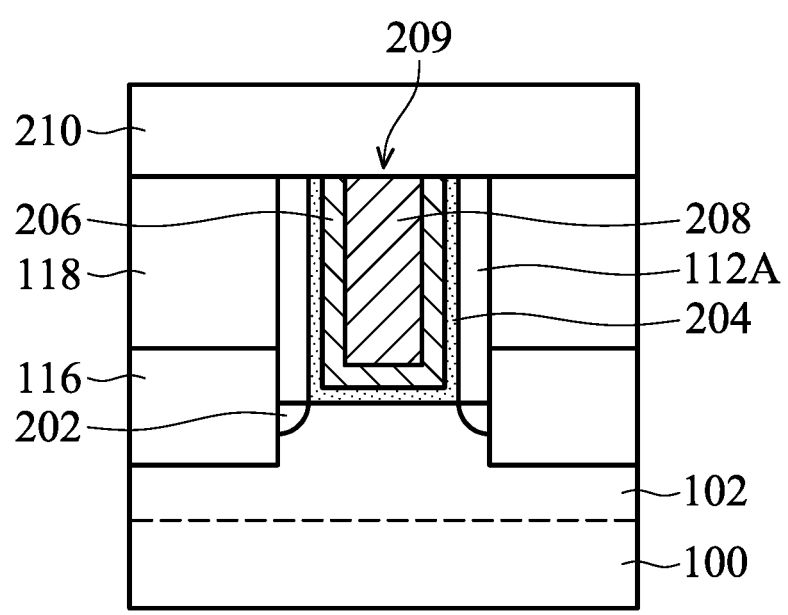

As shown in FIG. 2G, a dielectric layer 210 is deposited over the dielectric layer 118, the spacer elements 112A, and the metal gate stack 209, in accordance with some embodiments. The formation method and material of the dielectric layer 210 may be the same as or similar to those of the dielectric layer 118.

FIGS. 3A-3F are cross-sectional views of various stages of a process for forming a semiconductor device structure, in accordance with some embodiments. In some embodiments, FIGS. 3A-3F show some subsequent processes performed on the structure shown in FIG. 2G. In some embodiments, FIGS. 3A-3F are cross-sectional views taken along a line that is substantially perpendicular to the elongation direction of the fin structure 102 and penetrates through the epitaxial structure 116.

FIG. 2A shows a formation of a contact opening 320 in the dielectric layers 118 and 210, in accordance with some embodiments. The contact opening 320 exposes one of the epitaxial structures 116. In some other embodiments, the contact opening 320 exposes two or more of the epitaxial structures 116. In some embodiments, the dielectric layers 118 and 210 are partially removed to form the contact opening 320. The contact opening 320 may be formed using a photolithography process and an etching process. The contact opening 320 has an upper portion in the dielectric layer 210 and a lower portion in the dielectric layer 118. The upper portion of the contact opening 320 may have a trench-like profile. The lower portion of the contact opening may have a hole-like profile. The profile of the upper portion may be defined using the photolithography process. The profile of the lower portion may be automatically defined since it is formed using a self-aligned manner.

Figure 3A:
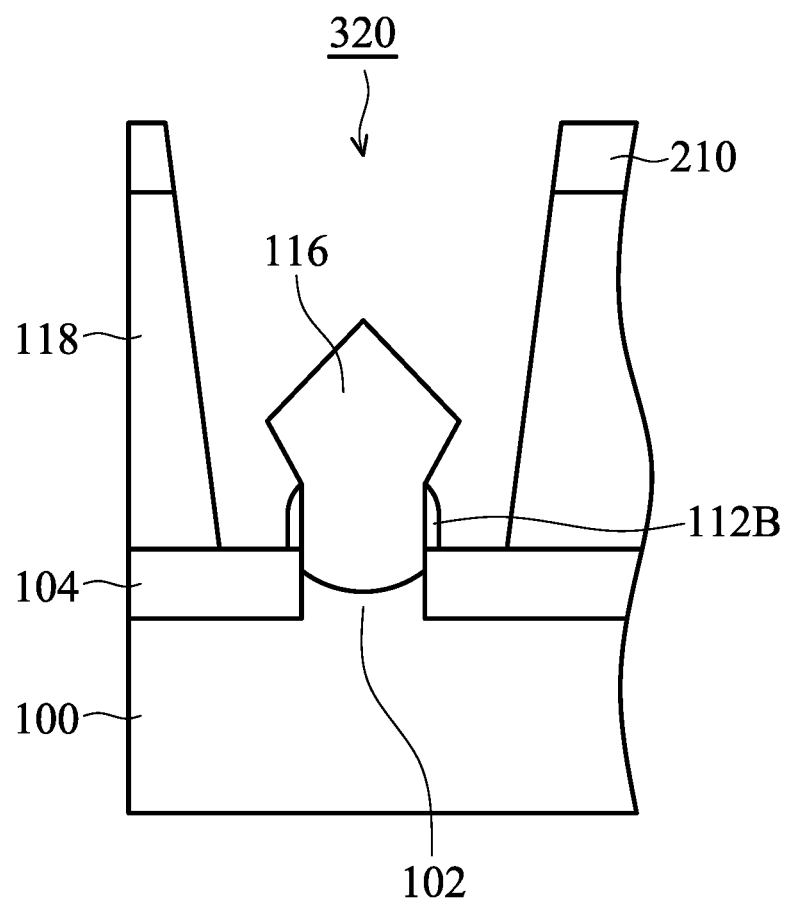
FIGS. 3A-3F are cross-sectional views of various stages of a process for forming a semiconductor device structure, in accordance with some embodiments.
Figure 3B:
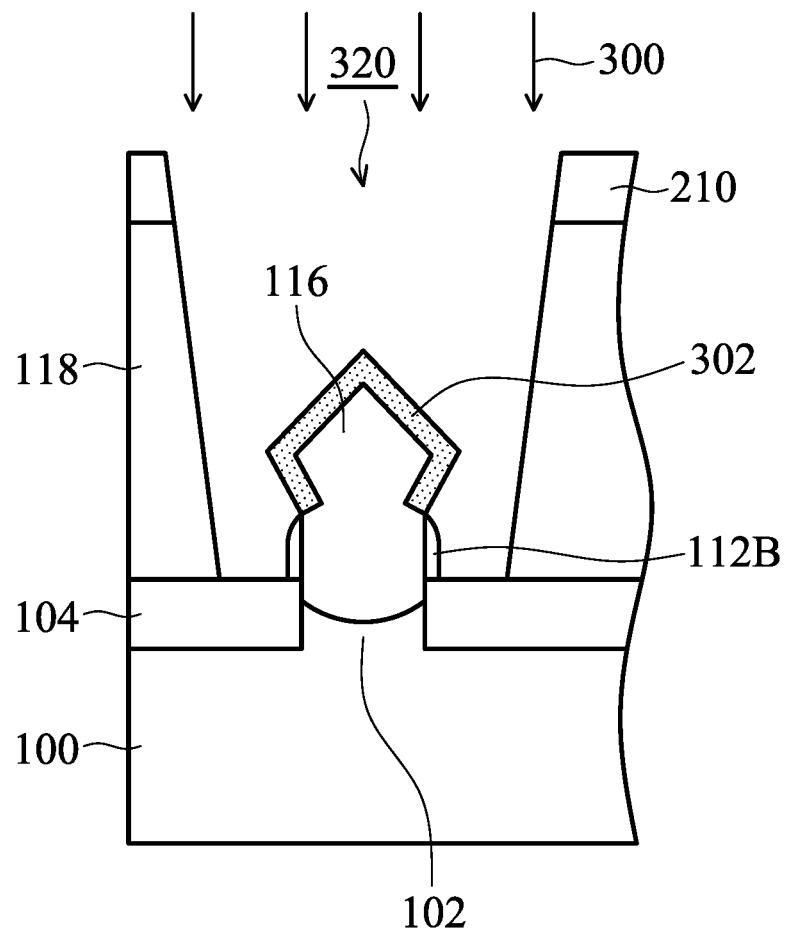

As shown in FIG. 3B, a modified region 302 is formed in the epitaxial structure 116, in accordance with some embodiments. In some embodiments, the modified region 302 extends along the entirety of the exposed surface of the epitaxial structure 116. In some embodiments, the modified region 302 has lower crystallinity than an inner portion of the epitaxial structure 116. The lower crystallinity of the modified region 302 may facilitate the subsequent formation of a metal-semiconductor region.

The metal-semiconductor region may be made of or include a metal silicide layer that helps to reduce resistance between the epitaxial structure 116 and a conductive contact to be formed over the epitaxial structure 116. In some embodiments, the modified region 302 includes an amorphous region, a polycrystalline region, or a combination thereof. In some embodiments, the inner portion of the epitaxial structure 116 is a single crystalline structure. In some embodiments, the modified region 302 has a smaller average grain size than that of the inner portion of the epitaxial structure 116.

In some embodiments, the modified region 302 is formed using an implantation process 300. The implantation process 300 may be an ion implantation process that is similar to the ion implantation process 204 illustrated in FIG. 2A. The implantation process 300 includes implanting a first dopant into the epitaxial structure 116. In some embodiments, the first dopant has a smaller atomic radius than that of silicon. In some embodiments, the first dopant is or includes carbon. In some embodiments, the implantation process 300 further includes implanting a second dopant into the semiconductor structure. In some embodiments, the second dopant has a greater atomic radius than that of boron. In some embodiments, the second dopant is or includes gallium. In some embodiments, the implanting of carbon is performed before the implanting of gallium. In some other embodiments, the implanting of carbon is performed after the implanting of gallium.

In some embodiments, the carbon dopants are implanted with a first dosage, and the gallium dopants are implanted with a second dosage. In some embodiments, the first dosage is greater than the second dosage. The first dosage may be in a range from about $2E14$ $cm^{-2}$ to about $1E15$ $cm^{-2}$. The second dosage may be in a range from about $1E14$ $cm^{-2}$ to about $5E14$ $cm^{-2}$.

In some embodiments, the smaller dopant (such as carbon) may occupy the interstitial sites in the epitaxial structure 116. Therefore, the larger dopant (such as gallium) may be prevented from diffusing away through interstitial diffusion. The quality of the modified region 302 may be controlled better.

In some embodiments, a thermal operation is performed after the implantation process 300. The modified region 302 may be heated at a temperature that is in a range from about 700 degrees C. to about 850 degrees C. The thermal operation may be performed using a laser anneal or another applicable process.

Figure 3C:
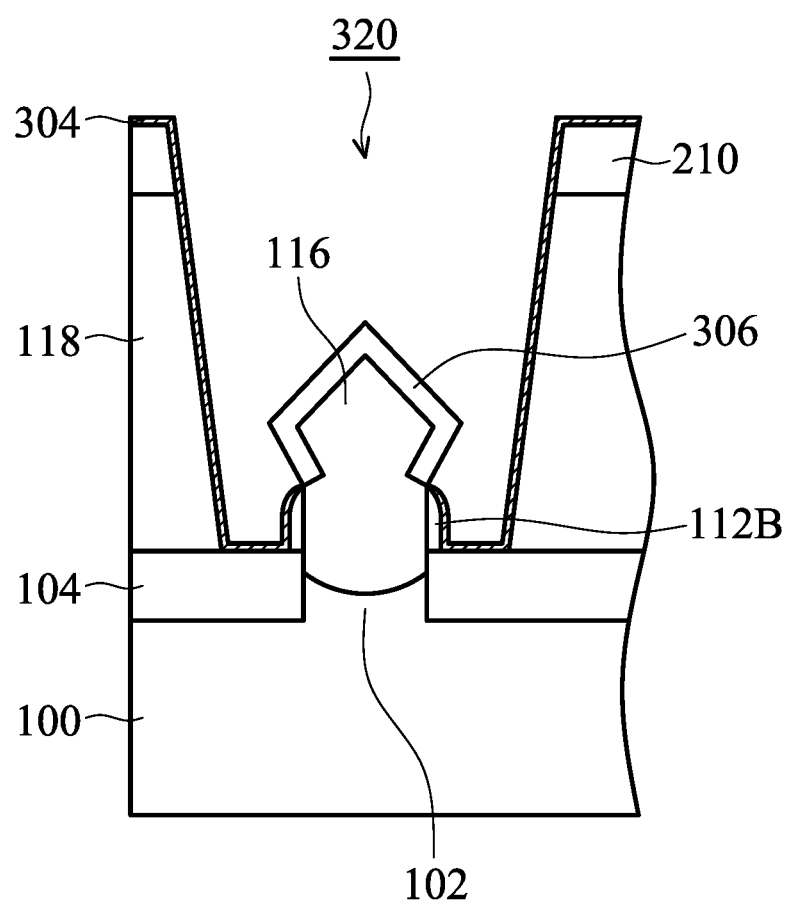

As shown in FIG. 3C, a metal-containing material is applied (or deposited) on the epitaxial structure 116 while the epitaxial structure 116 is heated, in accordance with some embodiments. Because the metal-containing material is applied during the heating of the epitaxial structure, the thermal energy may help to initiate chemical reaction between the surface portion of the epitaxial structure 116 and the metal-containing material. As a result, a surface portion of the epitaxial structure 116 reacts with the metal-containing material and is transformed into a metal-semiconductor compound region 306.

The metal-semiconductor compound region 306 may be made of or include a metal silicide material, a silicon-germanium-metal-containing material, a germanium-metal-containing material, or a combination thereof. In some embodiments, a portion or the entirety of the modified region 302 reacts with the metal-containing material to form the metal-semiconductor compound region 306.

In some embodiments, while applying or depositing the metal-containing material for forming the metal-semiconductor compound region 306, the metal-containing material is also applied (or deposited) on sidewalls and a bottom surface of the contact opening 320 to form a metal layer 304, as shown in FIG. 3C. In some embodiments, the metal layer 304 also extends on the surfaces of the support elements 112B. The metal layer 304 may be made of or include titanium, nickel, tantalum, cobalt, tungsten, platinum, one or more other suitable materials, or a combination thereof. In some embodiments, the metal-containing material is applied (or deposited) using a chemical vapor deposition process. In some embodiments, the metal-containing material is applied (or deposited) using an atomic layer deposition process.

As mentioned above, the metal-containing material is applied (or deposited) on the epitaxial structure 116 while the epitaxial structure 116 is heated. In some embodiments, the epitaxial structure 116 is heated to a temperature that is in a range from about 390 degrees C. to about 440 degrees C. In some embodiments, before the metal-containing material is applied (or deposited) on the epitaxial structure 116, the epitaxial structure 116 is heated to be at a raised temperature. Afterwards, the epitaxial structure 116 is kept at the raised temperature while the metal-containing material is applied (or deposited) on the epitaxial structure 116. The raised temperature may be in a range from about 390 degrees C. to about 440 degrees C.

Portions of the metal-containing material in contact with the sidewalls and the bottom surface of the contact opening 320 form the metal layer 304, as shown in FIG. 3C in accordance with some embodiments. A portion of the metal-containing material in contact with the epitaxial structure 116 reacts with the modified region 302 in the epitaxial structure 116 while the epitaxial structure 116 is heated. As a result, the metal-semiconductor compound region 306 is formed, as shown in FIG. 3C.

In some embodiments, the metal-semiconductor compound region 306 is made of or includes TiSi, TiSiGe, TiGe, one or more other suitable materials, or a combination thereof. In some embodiments, the metal-semiconductor compound region 306 is formed once the deposited metal-containing material touches the epitaxial structure 116 which is being heated. Therefore, a subsequent thermal operation (such as a rapid thermal annealing) may not be needed to initiate the reaction for forming the metal-semiconductor compound region 306. Fabrication cost and time may therefore been reduced significantly.

However, many variations and/or modifications can be made to embodiments of the disclosure. In some other embodiments, an optional thermal operation is used to tune the quality of the metal-semiconductor compound region 306.

Figure 3D:
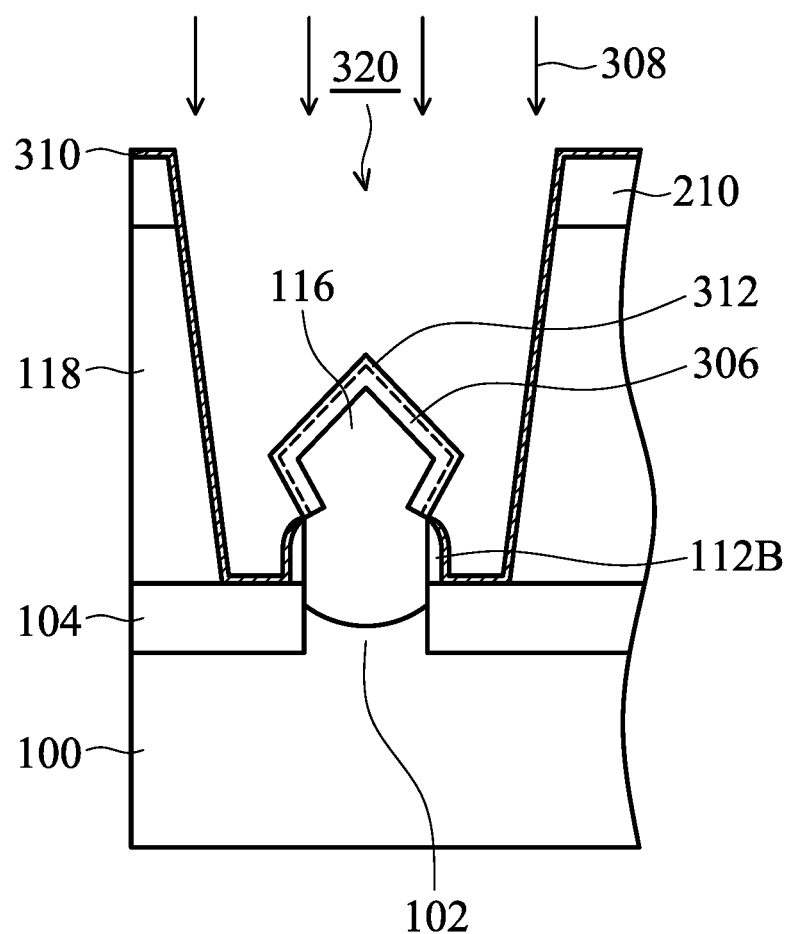

After the formation of the metal-semiconductor compound region 306, a protection region is formed. As shown in FIG. 3D, a modification process 308 is used to form a protection region 312, in accordance with some embodiments. The protection region 312 may prevent the metal-semiconductor compound region 306 from being oxidized and/or damaged during subsequent formation processes. In some embodiments, the metal layer 304 is also modified and transformed into a barrier layer 310. In some embodiments, the barrier layer 310 is also formed using the modification process 308. In these cases, the barrier layer 310 and the protection region 312 are formed simultaneously.

In some embodiments, the modification process 308 involves plasma. In some embodiments, the modification process 308 is a process involving nitrogen-containing plasma. In some embodiments, the reaction gases used for generating the nitrogen-containing plasma include $NH_3$, $N_2$, Ar, $H_2$, or a combination thereof. In some embodiments, the metal layer 304 is nitrogenized by the modification process 308 to become the barrier layer 310. The barrier layer 310 may be made of or include titanium nitride, tantalum nitride, nickel nitride, cobalt nitride, one or more other suitable materials, or a combination thereof. The barrier layer 310 may be used to prevent metal ions from a subsequently formed conductive contact from entering the dielectric layers 118 and 310.

In some embodiments, an upper portion of the metal-semiconductor compound region 306 is nitrogenized by the modification process 308 to become the protection region 312. In some embodiments, the protection region 312 is made of or includes TiSiGeN, TiGeN, TiSiGeGaN, TiGeGaN, one or more other suitable materials, or a combination thereof.

Figure 3E:
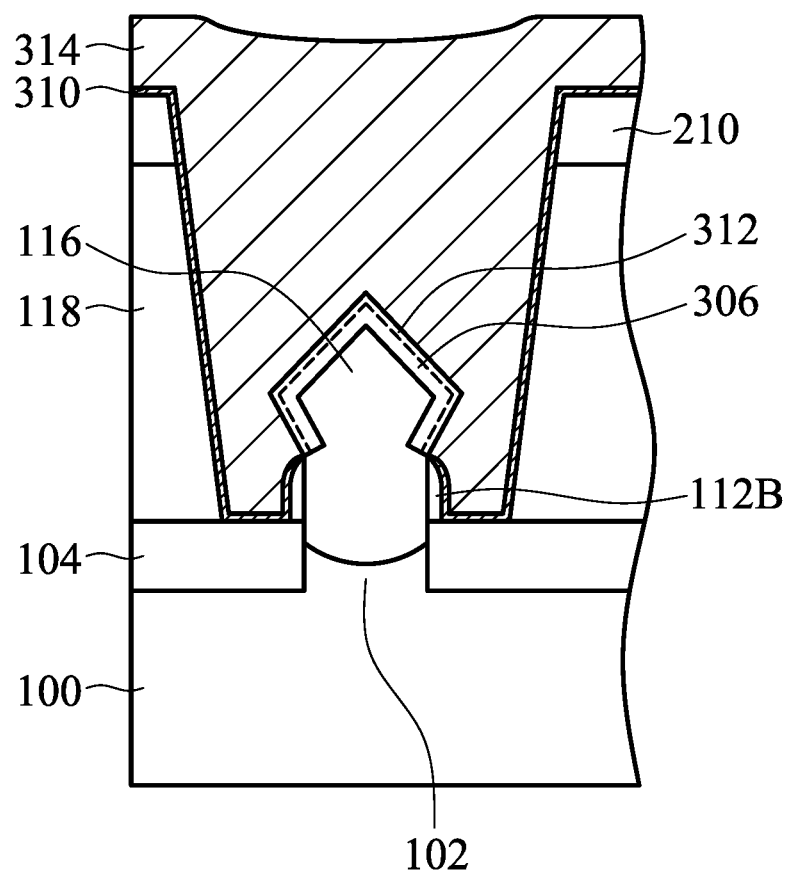

As shown in FIG. 3E, one (or more) conductive material 314 is deposited over the dielectric layer 210 to overfill the contact opening 320, in accordance with some embodiments. The conductive material 314 may be made of or include tungsten, cobalt, titanium, platinum, gold, copper, aluminum, one or more other suitable materials, or a combination thereof. The conductive material 314 may be deposited using an ALD process, a CVD process, a PVD process, an electroplating process, one or more other applicable processes, or a combination thereof.

Figure 3F:
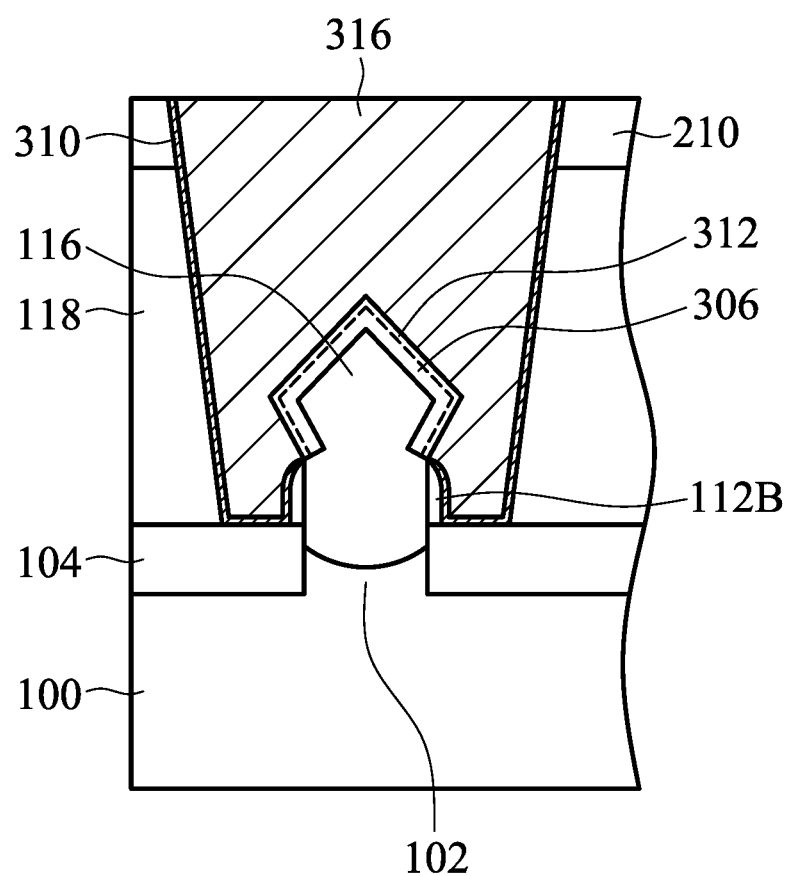

As shown in FIG. 3F, a planarization process is used to remove the conductive material 314 outside of the contact opening 320, in accordance with some embodiments. As a result, the remaining portion of the conductive material 314 in the contact opening 320 forms a conductive structure 316 is formed, as shown in FIG. 3F. The conductive structure 316 may function as a conductive contact electrically connected to a source/drain structure (i.e., the epitaxial structure 116). The planarization process mentioned above may include a CMP process, a grinding process, an etching process, a dry polishing process, one or more other applicable processes, or a combination thereof.

As mentioned above, in some embodiments, implanting smaller dopants (such as carbon) and larger dopants (such as gallium) is an effective method to improve the performance of the implanted semiconductor structure. The implanted semiconductor structure may include a p-type lightly doped source/drain region and/or a p-type epitaxially grown source/drain structure. However, embodiments of the disclosure are not limited thereto. In some other embodiments, the implantation process involving implanting smaller dopants (such as carbon) and larger dopants (such as gallium) is used to assist in the formation of n-type semiconductor structures.

Figure 4:
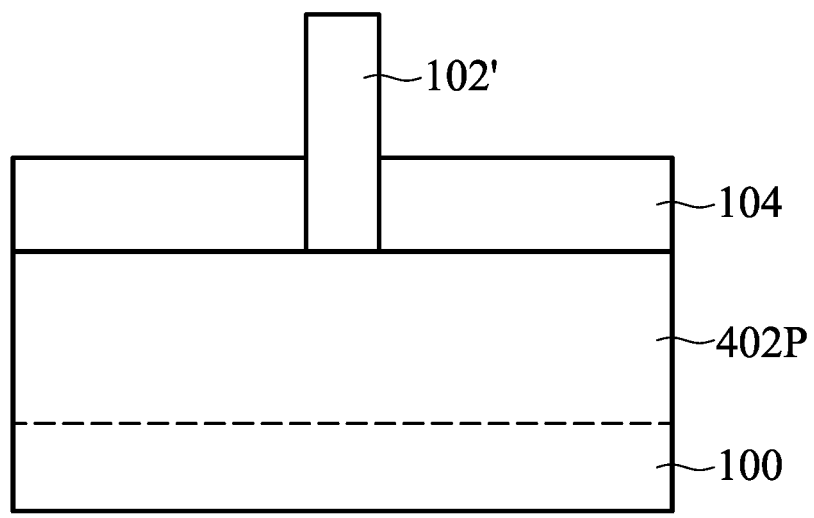
FIG. 4 is a cross-sectional view of a semiconductor device structure, in accordance with some embodiments.

FIG. 4 is a cross-sectional view of a semiconductor device structure, in accordance with some embodiments. In some embodiments, the semiconductor substrate 100 is implanted with smaller dopants (such as carbon) and larger dopants (such as gallium) to form a p-type well region 402P. For example, the ion implantation process 204 illustrated in FIG. 2A, the implantation process 300 illustrated in FIG. 3B, or the like may be performed on the semiconductor substrate 100 to form the p-type well region 402P. The p-type well region 402P may be used to isolate an NMOS device. In some embodiments, a thermal operation is then performed to heat the implanted semiconductor substrate 100 so as to activate the implanted dopants.

In some embodiments, the carbon dopants are implanted with a first dosage, and the gallium dopants are implanted with a second dosage. In some embodiments, the first dosage is greater than the second dosage. The first dosage may be in a range from about $5E13$ $cm^{-2}$ to about $1E14$ $cm^{-2}$. The second dosage may be in a range from about $2E13$ $cm^{-2}$ to about $5E13$ $cm^{-2}$.

In some embodiments, the p-type well region 402P has a dopant concentration of gallium that is in a range from about $1E17$ $cm^{-3}$ to about $1E18$ $cm^{-3}$. In some embodiments, the p-type well region 402P has a dopant concentration of carbon that is in a range from about $1E17$ $cm^{-3}$ to about $1E18$ $cm^{-3}$.

As shown in FIG. 4, a fin structure 102' is formed, and the isolation features 104 are formed to surround a lower portion of the fin structure 102', in accordance with some embodiments. The material and formation method of the fin structure 102' may be the same as or similar to those of the fin structures 102.

In some embodiments, the fin structure 102' is implanted with smaller dopants (such as carbon) and larger dopants (such as gallium). For example, the ion implantation process 204 illustrated in FIG. 2A, the implantation process 300 illustrated in FIG. 3B, or the like may be performed on the fin structure 102'. The portion of the fin structure 102' to be covered by a gate stack may serve as a channel region of an NMOS device. In some embodiments, a thermal operation is then performed to heat the implanted semiconductor substrate 100 so as to activate the implanted dopants.

In some embodiments, the carbon dopants are implanted with a first dosage, and the gallium dopants are implanted with a second dosage. In some embodiments, the first dosage is greater than the second dosage. The first dosage may be in a range from about $5E13$ $cm^{-2}$ to about $1E14$ $cm^{-2}$. The second dosage may be in a range from about $2E13$ $cm^{-2}$ to about $5E13$ $cm^{-2}$.

In some embodiments, the fin structure 102' has a dopant concentration of gallium that is in a range from about $1E17$ $cm^{-3}$ to about $1E18$ $cm^{-3}$. In some embodiments, the fin structure 102' has a dopant concentration of carbon that is in a range from about $1E17$ $cm^{-3}$ to about $1E18$ $cm^{-3}$.

Embodiments of the disclosure implanting smaller dopants (such as carbon) and larger dopants (such as gallium) into a semiconductor structure. The implanted dopants may be used to form doped regions such as lightly doped source/drain regions, p-type well region, and/or channel region of a fin structure. The implanted dopants may also be used to reduce the crystallinity of an epitaxial structure, which facilitates a subsequent formation of metal-semiconductor compound regions, such as metal silicide regions. The smaller dopants (such as carbon) may occupy interstitial sites in the implanted semiconductor structure, which prevent the larger dopants (such as gallium) from diffusing away. The performance and reliability of the implanted semiconductor structure are therefore improved.

In accordance with some embodiments, a method for forming a semiconductor device structure is provided. The method includes forming a semiconductor structure over a semiconductor substrate. The method also includes implanting carbon into the semiconductor structure. The method further includes implanting gallium into the semiconductor structure. In addition, the method includes heating the semiconductor structure after the implanting of carbon and gallium.

In accordance with some embodiments, a method for forming a semiconductor device structure is provided. The method includes forming a semiconductor structure over a semiconductor substrate. The method also includes implanting a first dopant into the semiconductor structure. The first dopant has a smaller atomic radius than that of silicon. The method further includes implanting a second dopant into the semiconductor structure. The second dopant has a greater atomic radius than that of boron. In addition, the method includes annealing the semiconductor structure after the implanting of the first dopant and the second dopant.

In accordance with some embodiments, a method for forming a semiconductor device structure is provided. The method includes implanting carbon into a semiconductor structure, and the semiconductor substrate contains germanium. The method also includes implanting gallium into the semiconductor structure. The method further includes heating the semiconductor structure after the implanting of carbon and gallium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a semiconductor structure over a semiconductor substrate, wherein the semiconductor structure is an epitaxially grown source/drain structure;
    forming a dielectric layer to cover the semiconductor structure;
    forming an opening in the dielectric layer to expose the semiconductor structure;
    implanting carbon into the semiconductor structure after the opening is formed;
    implanting gallium into the semiconductor structure, wherein the implanting of carbon is performed with a first dosage, the implanting of gallium is performed with a second dosage, the first dosage is greater than the second dosage, a ratio of the first dosage to the second dosage is in a range from about 2 to about 3.5, and the implanting of carbon is performed before the implanting of gallium;
    heating the semiconductor structure after the implanting of carbon and gallium; and
    forming a metal-containing layer on the semiconductor structure after implanting carbon and gallium.

2. The method for forming a semiconductor device structure as claimed in claim 1, wherein the semiconductor structure comprises germanium.

3. The method for forming a semiconductor device structure as claimed in claim 1, wherein the semiconductor structure comprises silicon germanium.

4. The method for forming a semiconductor device structure as claimed in claim 1, wherein forming the semiconductor structure comprises epitaxially growing a p-type source/drain structure over the semiconductor substrate.

5. A method for forming a semiconductor device structure, comprising:
    forming a semiconductor structure over a semiconductor substrate;
    forming a dielectric layer over the semiconductor structure;
    forming an opening in the dielectric layer to expose the semiconductor structure;
    implanting a first dopant into the semiconductor structure after the opening is formed, wherein the first dopant has a smaller atomic radius than that of silicon, and the first dopant comprises carbon;
    implanting a second dopant into the semiconductor structure, wherein the second dopant has a greater atomic radius than that of boron, and the second dopant comprises gallium, wherein the implanting of the first dopant is performed before the implanting of the second dopant, the implanting of the first dopant is performed with a first dosage, the implanting of the second dopant is performed with a second dosage, the first dosage is greater than the second dosage, and a ratio of the first dosage to the second dosage is in a range from about 2 to about 3.5;
    annealing the semiconductor structure after the implanting of the first dopant and the second dopant; and
    forming a metal-containing material directly on the semiconductor structure after implanting carbon and gallium, wherein the metal-containing material is formed while the semiconductor structure is kept at a raised temperature.

6. The method for forming a semiconductor device structure as claimed in claim 5, wherein the ratio of the first dosage to the second dosage is in a range from about 2 to about 3.

7. A method for forming a semiconductor device structure, comprising:
    forming a semiconductor structure over a semiconductor substrate, wherein the semiconductor structure is a fin structure;
    forming a dielectric layer to cover the semiconductor structure;
    partially removing the dielectric layer to expose the semiconductor structure;
    implanting carbon into a semiconductor structure after the dielectric layer is partially removed, wherein the semiconductor substrate contains germanium;
    implanting gallium into the semiconductor structure, wherein the implanting of carbon is performed before the implanting of gallium, the implanting of carbon is performed with a first dosage, the implanting of gallium is performed with a second dosage, the first dosage is greater than the second dosage, and a ratio of the first dosage to the second dosage is in a range from about 2 to about 3.5; and
    heating the semiconductor structure after the implanting of carbon and gallium.

8. The method for forming a semiconductor device structure as claimed in claim 7, wherein the ratio of the first dosage to the second dosage is in a range from about 2 to about 3.

9. The method for forming a semiconductor device structure as claimed in claim 5, wherein the semiconductor structure comprises a semiconductor substrate, a semiconductor fin structure, or a source/drain structure.

10. The method for forming a semiconductor device structure as claimed in claim 5, further comprising forming a metal-semiconductor compound region directly on the semiconductor structure.

11. The method for forming a semiconductor device structure as claimed in claim 1, wherein a ratio of the first dosage to the second dosage is in a range from about 2 to about 3.

12. The method for forming a semiconductor device structure as claimed in claim 5, further comprising:
    forming a dummy gate stack over the semiconductor substrate before the semiconductor structure is formed; and
    replacing the dummy gate stack with a metal gate stack after the formation of the dielectric layer and before the formation of the opening.

13. The method for forming a semiconductor device structure as claimed in claim 1, wherein the metal-containing material is formed while the semiconductor structure is kept at a raised temperature.

14. The method for forming a semiconductor device structure as claimed in claim 13, wherein the raised temperature is in a range from about 390 degrees C. to about 440 degrees C.

15. The method for forming a semiconductor device structure as claimed in claim 5, wherein the raised temperature is in a range from about 390 degrees C. to about 440 degrees C.

16. The method for forming a semiconductor device structure as claimed in claim 5, wherein the metal-containing layer further has a portion extending along sidewalls of the opening, and the method further comprises transforming the portion of the metal-containing layer extending along the sidewalls of the opening into a barrier layer.

17. The method for forming a semiconductor device structure as claimed in claim 16, wherein the portion of the metal-containing layer is transformed into the barrier layer by introducing a nitrogen containing plasma into the portion of the metal-containing layer.

18. The method for forming a semiconductor device structure as claimed in claim 7, further comprising forming a metal-containing layer on the semiconductor structure after the implanting of carbon and gallium.

19. The method for forming a semiconductor device structure as claimed in claim 18, wherein the metal-containing material is formed while the semiconductor structure is kept as a raised temperature.

20. The method for forming a semiconductor device structure as claimed in claim 19, wherein the raised temperature is in a range from about 390 degrees C. to about 440 degrees C.

* * * * *